United States Patent [19]

Pelley, III

[11] Patent Number: 4,551,641
[45] Date of Patent: Nov. 5, 1985

[54] SENSE AMPLIFIER

[75] Inventor: Perry H. Pelley, III, Austin, Tex.

[73] Assignee: Motorola, Inc., Schaumburg, Ill.

[21] Appl. No.: 554,517

[22] Filed: Nov. 23, 1983

[51] Int. Cl.[4] .......................... H03K 5/24; G11C 7/06
[52] U.S. Cl. .................................... 307/530; 365/205; 307/279
[58] Field of Search ............... 307/530, 362, 355, 279; 365/205, 207, 208

[56] References Cited

U.S. PATENT DOCUMENTS

| | | | |
|---|---|---|---|
| 3,838,295 | 9/1974 | Lindell | 307/530 X |
| 4,000,413 | 12/1976 | Wong et al. | 307/355 X |
| 4,003,035 | 1/1977 | Hoffmann et al. | 307/530 X |
| 4,081,701 | 3/1978 | White, Jr. et al. | 307/530 |
| 4,169,233 | 9/1979 | Haraszti | 307/355 |
| 4,441,171 | 4/1984 | Hoffmann | 307/530 X |

FOREIGN PATENT DOCUMENTS

| | | | |
|---|---|---|---|
| 84636 | 7/1978 | Japan | 307/530 |
| 112131 | 1/1979 | Japan | 307/530 |

OTHER PUBLICATIONS

Chao et al., "CMOS Sense-Restore Circuits for One-Device FET Dynamic RAM"; *IBM-TDB*; vol. 25, No. 10, pp. 5088-5091; 3/1983.
Bishop et al., "High-Sensitivity, High-Speed FET Sense Latch"; IBM-TDB; vol. 18, No. 4, pp. 1021-1022; 9/1975.

*Primary Examiner*—Larry N. Anagnos
*Attorney, Agent, or Firm*—Anthony J. Sarli, Jr.; Jeffrey Van Myers; James L. Clingan, Jr.

[57] ABSTRACT

A sense amplifier is coupled to a pair of bit lines for detecting and amplifying a voltage differential therebetween. The sense amplifier has a first differential amplifier coupled to the pair of bit lines enabled in response to a first signal. The sense amplifier also has a second differential amplifier coupled to the pair of bit lines which is enabled a predetermined time duration following the occurrence of the first signal.

3 Claims, 2 Drawing Figures

SENSE AMPLIFIER

FIELD OF THE INVENTION

This invention relates to sense amplifiers, and more particularly, to clocked sense amplifiers for use in a memory which has bit line pairs.

BACKGROUND OF THE INVENTION

As memories become more and more dense, not only are there more memory cells, there are also more sense amplifiers, decoders, address buffers and other circuitry necessary for the operation of the memory. Consequently for a given probability of a failure of a single circuit type, the more of the circuit type that is present, the more likely the memory device will contain a failure, making the whole device defective. One approach is to use redundancy techniques. This of course requires additional chip area as well as requiring repair time and repair equipment which can be very expensive. Another approach is to reduce the probability of one of the circuit elements being a failure.

In the case of sense amplifiers, the failure mode of most concern is offset of the differential amplifier. Of course other defects can cause sense amplifier failure as well, but these other defects will likely be evident at other locations on the memory chip, causing other failures. Offset of the differential amplifier can be from causes which do not result in failures anywhere else on the chip. Consequently, it is particularly desirable to avoid sense amplifier failure due to offset. A typical differential amplifier is a cross-coupled pair of transistors. The offset in such a case is from two major causes which can appear together or independently. One major cause is threshold voltage differential between the two transistors. The other major cause is gain differential between the two transistors. The cause of gain differential is typically effective gate length differential. Although gains and threshold voltages vary substantially from one chip to another due to processing variations, gains and threshold voltages are matched quite closely on a given chip. Nonetheless, there is some variation even on the same chip. As the number of sense amplifiers increase as the density increases, the probability of there being enough gain and/or threshold voltage variation to cause an offset failure on at least one sense amplifier increases.

One technique to reduce failures due to offset is to enable the cross-coupled amplifier relatively slowly. This is to avoid having large current flow. Large current flow amplifies the offset problem for the case of threshold voltage differential. Another variation of this approach is to enable the cross-coupled pair with a weak transistor which provides significant current limiting, then subsequently enabling the cross-coupled pair with a much higher gain transistor. These approaches are useful but do not provide much help for the gain differential situation.

In a cross-coupled pair sense amplifier, the amplifier feeds back to the bit lines. This is typically necessary to restore data in the selected storage cell. The sense amplifier is expected to be able to detect a voltage differential of 75 millivolts on the bit lines. For the case in which the amplifier has minimal offset, the amplifier senses the voltage differential on the bit lines and begins to further increase the voltage differential. In the case where there is significant offset, the amplifier may actually begin pulling the bit lines closer together in voltage. Once this begins the amplifier will eventually cause the voltage on the bit lines to cross-over and reverse the data. This failure mode is the kind that can occur to a single sense amplifier on the chip while there are no other failures on the chip.

SUMMARY OF THE INVENTION

An object of the invention is to provide an improved sense amplifier.

Another object of the invention is to provide a sense amplifier with reduced probability of failure.

Yet another object of the invention is to provide a sense amplifier with improved offset immunity.

These and other objects of the invention are provided in a sense amplifier which has a first differential amplifier and a second differential amplifier coupled to a pair of bit lines. The first differential amplifier is enabled by a first signal. The second differential amplifier is enabled a predetermined time duration following the occurrence of the first signal.

DESCRIPTION OF THE INVENTION

Figure 1:
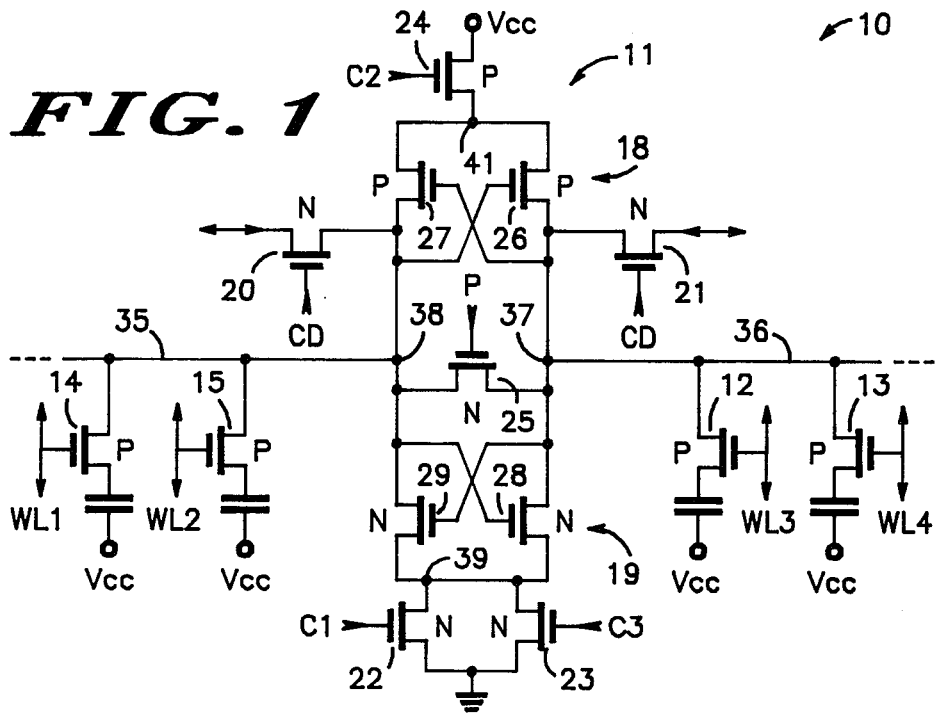
FIG. 1 is a schematic diagram of a portion of a dynamic random access memory which includes a sense amplifier according to a preferred embodiment of the invention.

Shown in FIG. 1 is a portion of a dynamic random access memory (DRAM) 10 comprised generally of a sense amplifier 11, a storage cell 12, a storage cell 13, a storage cell 14, and a storage cell 15. Sense amplifier 11 is comprised of a P channel cross-coupled differential amplifier 18, an N channel cross-coupled differential amplifier 19, an N channel coupling transistor 20, an N channel coupling transistor 21, an N channel enabling transistor 22, an N channel enabling transistor 23, a P channel enabling transistor 24, and an N channel coupling transistor 25. Amplifier 18 comprises a P channel transistor 26 and a P channel transistor 27. Amplifier 19 comprises an N channel transistor 28 and an N channel transistor 29.

Storage cells 12–15 use P channel pass transistors. Although N channel pass transistors have been commonly used in DRAMs, P channel storage cells 12–15 are well known in the art. P channel transistors 24, 26, and 27 are enhancement mode, P channel insulated gate field effect transistors with a threshold voltage of $-0.6$ to $-0.9$ volt. N channel transistors 22, 23, 25, 28, and 29 are enhancement mode, N channel insulated gate field effect transistors having a threshold voltage of 0.6 to 0.9 volt.

Storage cells 14 and 15 are coupled between a bit line 35 and a positive power supply terminal $V_{cc}$ for receiving a positive power supply voltage, for example 5 volts. Storage cells 14 and 15 are enabled in response to receiving signals on word lines WL1 and WL2, respectively. Storage cells 12 and 13 are coupled between a bit line 36 and $V_{cc}$, and are enabled in response to receiving signals on word lines WL3 and WL4, respectively. Sense amplifier 11 is coupled to a pair of bit lines 35 and 36 for detecting a differential voltage therebetween.

In conventional fashion storage cells 12–15 store a logic high or a logic low. When one of storage cells 12-15 is enabled it provides a voltage deviation, which corresponds to the stored logic state, from the bias level on the bit line (35 or 36) to which it is coupled. A stored logic high will cause an increase in voltage whereas a logic low will cause a decrease in voltage. If a storage cell on bit line 35 is enabled, then no storage cell on the opposite bit line, bit line 36, will be enabled. Consequently, bit line 36 provides a bias level which is approximately halfway between the voltage level of a logic high and a logic low. Regardless of the logic state of the storage cell on bit line 35, there is a voltage differential established between bit lines 35 and 36 for sense amplifier 11 to detect. Although dummy cell techniques are more common, this technique is well known in the art. The situation is much the same for a static random access memory (SRAM) as well. In a SRAM each storage cell provides a pair of outputs to a pair of bit lines for establishing a voltage differential for detection by a sense amplifier. In the case of a read only memory (ROM) in which the storage cell has only one output, much the same technique as for DRAMs can be used for establishing a voltage differential on a pair of bit lines for detection by a sense amplifier.

Sense amplifier 11 has a node 37 connected to bit line 36 and a node 38 connected to bit line 35. Transistor 29 has a drain connected to node 38, a gate connected to node 37, and a source connected to a node 39. Transistor 28 has a drain connected to node 37, a gate connected to node 38, and a source connected to node 39. Transistor 22 has a drain connected to node 39, a source connected to ground, and a gate for receiving a clock signal C1. Transistor 23 has a drain connected to node 39, a source connected to ground, and a gate for receiving a clock signal C3. Transistor 27 has a drain connected to node 38, a source connected to a node 41, and a gate connected to node 37. Transistor 26 has a drain connected to node 37, a source connected to node 41, and a gate connected to node 38. Transistor 24 has a drain connected to node 41, a source connected to $V_{cc}$, and a gate for receiving a clock signal C2. Transistor 25 has a first current electrode connected to node 37, a second current electrode connected to node 38, and a control electrode for receiving a precharge signal P. Transistor 25 is for equalizing the voltage on bit lines 35 and 36 during a precharge cycle. The first and second current electrodes will vary as to functioning as a source or drain. Transistor 20 has a first current electrode connected to node 38, a control electrode for receiving a column decoder signal CD, and a second current electrode. Transistor 21 has a first current electrode conected to node 37, a control electrode for receiving column decoder signal CD, and a second current electrode. The second current electrodes of transistors 20 and 21 are connected to read/write circuitry (not shown) of the memory, typically via bit sense common lines. Data is coupled into or out of sense amplifier 11 when signal CD is present which is responsive to column decoding.

The primary advantages of sense amplifier 11 are when data is sensed as distinguished from written. In a DRAM storage cells must be refreshed periodically which requires sensing. In the write mode only one column is selected for writing while all other columns must be involved in refreshing. It is to be understood that in a memory there would be additional bit line pairs coupled to other sense amplifiers than those shown in FIG. 1, and that there would be additional storage cells coupled to bit lines 35 and 36 than those shown in FIG. 1.

Figure 2:
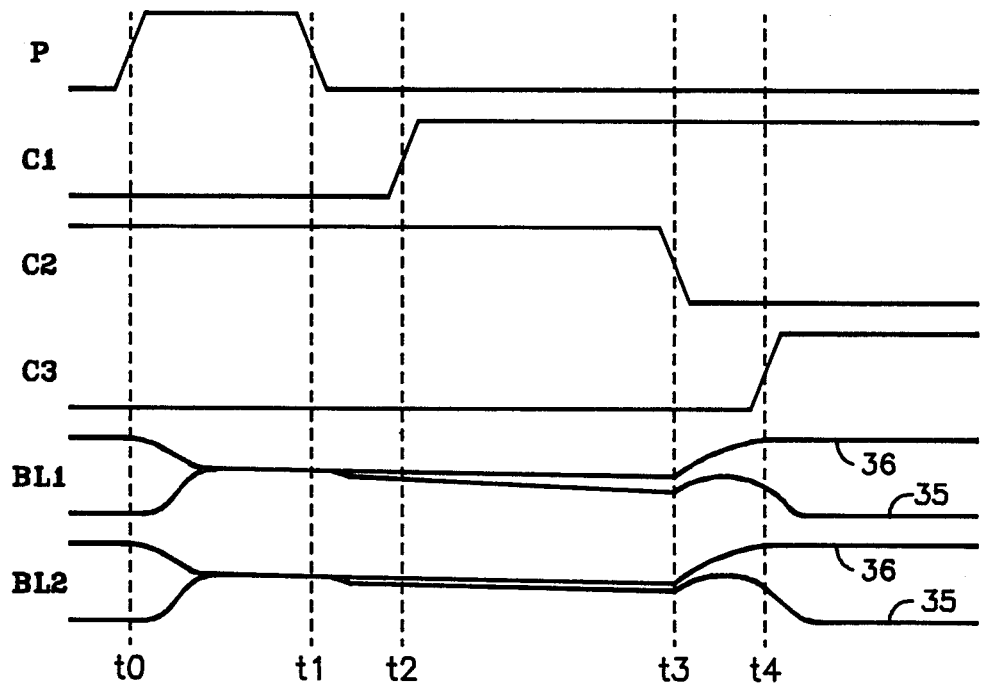
FIG. 2 is a timing diagram of signals relevant to the memory of FIG. 1 and useful in understanding the preferred embodiment of the invention.

Operation of sense amplifier 11 is explained in conjunction with signals shown in FIG. 2. At a time $t_0$, precharge signal P switches to a logic high causing transistor 25 to equalize the voltage on bit lines 35 and 36 during the precharge cycle. At a time $t_1$ after bit lines 35 and 36 have equalized, the precharge period terminates with signal P switching to a logic low, turning off transistor 25. During the precharge cycle, clock signals C1 and C3 are a logic low and signal C2 is a logic high, ensuring that transistors 22, 23 and 24 are turned off. With transistors 23, 24, and 25 turned off, amplifiers 18 and 19 are disabled. Some time after the precharge cycle one of the storage cells on one of bit lines 35 and 36 is enabled. FIG. 2 shows two cases, BL1 and BL2, for bit lines 35 and 36. Case BL1 will be described first. Case BL1 is the typical case when cross-coupled amplifier 19 does not have a significant offset. When a storage cell is enabled, no storge cell on the opposite bit line is enabled. For example, storage cell 12 is enabled, but no storage cell coupled to bit line 35 is enabled. Regardless of the logic state of storage cell 12, there will be a voltage differential between bit lines 35 and 36, i.e., bit lines 35 and 36 will separate. The separation is nominally 200 millivolts but can be expected to be as low as 75 millivolts or even lower. Accordingly, the design goal for detection by a sense amplifier with significant offset was chosen to be 75 millivolts. Sense amplifiers without offset would obviously be able to detect even lower voltage differentials. After the separation caused by enabling storage cell 12, clock signal C1 enables amplifier 19 for the purpose of amplifying the voltage differential on bit lines 35 and 36 and cause them to separate further. This is achieved by clock signal C1 switching to a logic high at time $t_2$ to turn on transistor 22. Transistor 22 is of relatively low gain so that node 39 does not quickly reach ground potential. Because of this relatively high resistance of transistor 22, amplifier 19 does not cause a rapid separation of bit lines 35 and 36. Although at this time both transistors 28 and 29 are conducting, one is receiving a higher gate voltage so that it is more conductive. For example, if a logic high is stored in storage cell 12, node 37 will be at a higher voltage than node 38 in which case transistor 29 will be more conductive than transistor 28. This will cause node 38 to drop in voltage faster than node 37, thereby increasing the voltage differential between bit line 35 and 36. Approximately 12 nanoseconds after time $t_2$, at time $t_3$, clock C2 enables amplifier 18 by switching to a logic low which turns on transistor 24. Transistor 24 has a higher gain than transistor 22 so that node 41 approaches the voltage at $V_{cc}$ faster than node 39 approached ground between times $t_2$ and $t_3$. When amplifier 18 is enabled, the bit lines have separated sufficiently that, even if amplifier 18 has significant offset, the bit lines will be separated even further. A principle of cross-coupled amplifiers is that the gain thereof increases with voltage differential. Consequently, in case BL1 of bit lines 35 and 36 shown in FIG. 2, amplifier 19 amplifies the voltage differential between bit lines 35 and 36 from time $t_2$ to time $t_3$. Even if amplifier 18 had a sufficiently high offset problem to be unable to amplify a 75 millivolt bit line differential or even worse if the offset would actually cause amplifier 18 to have some negative gain at a 75 millivolt bit line differential, the additional separation caused by amplifier 19 from time $t_2$ to time $t_3$ will be sufficient for amplifier 19 to have positive gain so that the voltage differential between bit lines 35 and 36 will be significantly increased.

About 5 nanoseconds after time $t_3$ at time $t_4$, clock signal C3 turns on transistor 23 to pull node 39 to ground potential. This allows the bit line at the logic low to reach ground potential more rapidly, in this case bit line 35. This also helps bit line 36 reach the voltage at $V_{cc}$ because transistor 28 is consequently turned completely off. It is important that the bit lines reach the voltage at the power supply terminals, ground and $V_{cc}$ as appropriate, for refresh purposes as well as for subsequent equalization of bit lines 35 and 36 during the precharge cycle.

For case BL2 for bit lines 35 and 36, amplifier 19 is assumed to have relatively significant offset. The circuit responds the same way as for case BL1 until time $t_2$. At time $t_2$ amplifier 19 is enabled in response to clock C1 as in case BL1 but amplifier 18, due to offset, does not cause a further separation of bit lines 35 and 36. In this case, where storage cell 12 is enabled and stores a logic high, node 37 will be at a higher voltage than node 38. The offset which causes problems in this context is caused by transistor 29 having a lower gain than transistor 28 and transistor 29 having a higher threshold voltage than transistor 28. In one embodiment, it was assumed there could be a 50 millivolt threshold voltage variation and 10% gain differential. Transistor 22 was chosen to be of sufficiently low gain that the voltage differential would deteriorate to no less than 50 millivolts from time $t_2$ to time $t_3$. At time $t_3$ amplifier 18 would be enabled by clock signal C2 switching to a logic low. In this case, amplifier 18 is assumed to have very little offset. Consequently, amplifier 18 amplifies the voltage differential between bit lines 35 and 36. Because transistor 24 is of relatively high gain, bit lines 35 and 36 separate more rapidly than between times $t_2$ and $t_3$ for case BL1. When clock signal C3 enables transistor 23 at time $t_4$ there is already substantial bit line separation so that the bit lines are quickly pulled to the voltages at $V_{cc}$ and ground as appropriate.

In the case where both amplifiers 18 and 19 have significant offset there may well be a failure. That both amplifiers would have significant offset is very unlikely because the offsets are independent of each other. The cause of offset for N channel amplifier 19 is substantially independent of the cause of offset of P channel amplifier 18. Additionally, the offsets would have to be in the same direction, i.e., the offset causes the amplifier to favor one logic state of a bit line over another. If the offsets of amplifiers 18 and 19 favored opposing logic states, there would not be a failure unless of course one of the offsets was extraordinarily severe in which case there would be a failure anyway. For example, if amplifier 19 favored node 37 at a logic high but amplifier 18 favored node 37 at a logic low, bit line separation would actually be greater between times $t_2$ and $t_3$ than for case BL1. Consequently, amplifier 18 would have even less difficulty in further amplifying the bit line voltage differential than in case BL1. Conversely if amplifier 19 favored node 37 at a logic low, but amplifier 18 favored node 37 at a logic high, the bit line separation between times $t_2$ and $t_3$ would be like case BL2. At time $t_3$ amplifier 18 would have even less difficulty, due to its offset favoring node 37 at a logic high, than in case BL2 in amplifying the bit line separation.

It should be pointed out that amplifier 18 could also be enabled first with subsequent enabling of amplifier 19. In such a case amplifier 18 would be double clocked instead of amplifier 19 being doubled clocked. Another area of design choice is whether to have separate clocking transistors for each sense amplifier or have one transistor for many or even all of the sense amplifiers. Transistors 22, 23, and 24 could provide the necessary clocking for many sense amplifiers. In the particular embodiment chosen, such sense amplifier had a transistor analogous to transistor 24, whereas transistors 22 and 23 were common to many sense amplifiers. Typical considerations for this design choice are wave shaping, capacitive coupling and loading, and chip area.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. A sense amplifier coupled to a pair of bit lines for sensing and amplifying a voltage differential between the pair of bit lines, comprising:

a first n channel transistor having a first current electrode coupled to a first bit line of the pair of bit lines, a control electrode coupled to a second bit line of the pair of bit lines, and a second current electrode;

a second n channel transistor having a first current electrode coupled to the second bit line, a control electrode coupled to the first bit line, and a second current electrode coupled to the second current electrode of the first transistor;

a third n channel transistor having a first current electrode coupled to the second current electrodes of the first and second n channel transistors, a control electrode for receiving a first signal, and a second current electrode coupled to a first power supply terminal;

a first p channel transistor having a first current electrode coupled to the first bit line, a control electrode coupled to the second bit line, and a second current electrode;

a second p channel transistor having a first current electrode coupled to the second bit line, a control electrode coupled to the first bit line, and a second current electrode coupled to the second current electrode of the first p channel transistor;

a third p channel transistor having a first current electrode coupled to the second current electrodes of the first and second p channel transistors, a control electrode for receiving a second signal, and a second current electrode coupled to a second power supply terminal; and a fourth n channel transistor having a first current electrode coupled to the second current electrodes of the first and second n channel transistors, a control electrode for receiving a third signal, and a second current electrode coupled to the first power supply terminal;

wherein the second signal switches to a logic low a predetermined time duration after the first signal switches to a logic high, and the third signal switches to a logic high a predetermined time duration after the second signal switches to a logic low.

2. The sense amplifier of claim 1 wherein the third p channel transistor, the third n channel transistor, and the fourth n channel transistor each have a gain, the gain of the fourth n channel transistor being greater than the gain of the third p channel transistor, and the gain of the third p channel transistor being greater than the gain of the third n channel transistor.

3. The sense amplifier of claim 2 further comprising a fifth n channel transistor having a first current electrode coupled to the first bit line, a second current electrode coupled to the second bit line, and a control electrode for receiving a fourth signal.

* * * * *